United States Patent [19]

Ohmura et al.

[11] 4,047,119
[45] Sept. 6, 1977

[54] TRANSISTOR DIFFERENTIAL AMPLIFIER CIRCUIT

[75] Inventors: Yoshito Ohmura, Hachio; Takahiro Okabe; Hiroshi Morozumi, both of Tokyo, all of Japan

[73] Assignee: Hitachi, Ltd., Japan

[21] Appl. No.: 660,819

[22] Filed: Feb. 24, 1976

[30] Foreign Application Priority Data

Feb. 26, 1975   Japan ................................ 50-22890

[51] Int. Cl.² ........................................... H03F 3/45
[52] U.S. Cl. ............................... 330/30 D; 330/19; 330/22; 330/69
[58] Field of Search .................. 330/19, 22, 30 D, 69

[56] References Cited

U.S. PATENT DOCUMENTS

| | | | |
|---|---|---|---|
| 3,401,350 | 9/1968 | Barton et al. | 330/30 D |
| 3,461,397 | 8/1969 | Cunningham | 330/30 D |
| 3,761,787 | 9/1973 | Davis et al. | 330/30 DX |
| 3,894,290 | 7/1975 | Schoeff | 330/30 DX |

*Primary Examiner*—Rudolph V. Rolinec
*Assistant Examiner*—Lawrence J. Dahl
*Attorney, Agent, or Firm*—Craig & Antonelli

[57] ABSTRACT

A transistor differential amplifier circuit includes a pair of NPN type amplifying transistors operated by a constant current source commonly connected to their emitters, and a pair of PNP type load transistors inserted in the collector circuits of said amplifying transistors, respectively. The load transistors are commonly biased with a constant voltage to operate within their saturation regions when input signals supplied on respective bases of the amplifying transistors are balanced, whereby pulse signals with a controlled duty ratio are obtained from the respective collectors of the amplifying transistors.

23 Claims, 4 Drawing Figures

1

TRANSISTOR DIFFERENTIAL AMPLIFIER CIRCUIT

BACKGROUND OF THE INVENTION

This invention relates to a transistor differential amplifier circuit which produces output pulse signals from sine wave input signals, and, more particularly, to a transistor differential amplifier circuit which provides a controlled duty radio of the output pulse signals at a desired value.

In a brushless motor using Hall-effect elements, for example, a transistor differential amplifier has generally been utilized to amplify sine wave signals generated by the Hall-effect elements. Using such a transistor differential amplifier circuit having a sufficiently high value of amplification factor, pulse shape output signals can be obtained from the sine wave input signals.

These pulse shape signals are supplied to the field coils of the brushless motor as their field currents, whereby rotating magnetic fields for rotating a rotor are produced. In this case, it becomes necessary to vary the duty ratio of the pulse shape signals obtained from the differential amplifier in order to control the rotating magnetic fields. According to the conventional differential amplifier circuit, however, it has been difficult to vary the duty ratio of the pulse shape output signals delivered therefrom. In the previous amplifier circuitry, the derived pulse shape output signals have a duty ratio fixed at 50% of the input sine wave signal since these pulse shape output signals have been delivered corresponding to the half cycle of the input sine wave signals only.

SUMMARY OF THE INVENTION

Accordingly, one of the objects of the present invention is to provide an improved transistor differential amplifier circuit which is able to produce output pulse signals with any desired value of duty ratio from the sine wave input signals.

It is another object of the present invention to provide an improved transistor differential amplifier circuit capable of being produced in small sizes by using semiconductor integrated circuit technology.

It is a further object of the present invention to provide an improved multi-stage transistor differential amplifier circuit which is able to produce output pulse signals suitable for use as field currents in a brushless motor from sine wave input signals produced by Hall-effect elements.

In accomplishing these and other objects, in accordance with the present invention, a transistor differential amplifier circuit has been provided, which includes a pair of amplifying transistors connected to each other by their emitters, and a pair of load transistors, each connected in the collector circuits of each amplifying transistors, respectively. The amplifying transistors are commonly provided with a first constant current source at their connected emitters, and are supplied input sine wave signals to their bases, respectively.

Each of the load transistors is of a type opposite to that of the amplifying transistors and is commonly operated by a second constant current source, so that the currents flowing through the collector circuits of the amplifying transistors are also affected by the load transistors. As will be described in more detail hereinafter, the sink current value of the second constant current source will affect the pulse width of the output pulse signals delivered from the respective collectors of the amplifying transistors. By designing the magnitude of the respective sink currents of first and second constant current sources to have a predetermined relationship therebetween, output pulse signals with a desired duty ratio value are obtained.

The advantages, manner or operation, and novel features of the present invention will be best understood from the following detailed description, when read in connection with the accompanying drawings.

DETAILED DESCRIPTION OF THE PREFERRED EMBODIMENTS

Figure 1:
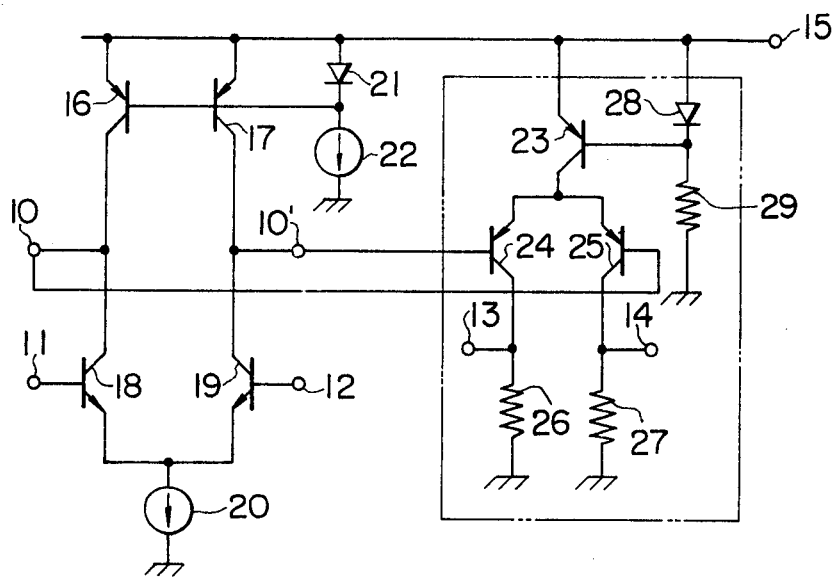
FIG. 1 is a schematic circuit diagram showing the fundamental composition of the transistor differential amplifier circuit embodying the present invention.

Referring to FIG. 1 a transistor circuit consisting of first and second differential amplifier stages which embodies the present invention is shown. The first amplifier stage includes a pair of NPN type amplifying transistors 18 and 19, whose emitters are connected to each other and are commonly connected to a first constant current source 20. The amplifying transistors 18 and 19 are connected to receive input signals through the input terminals 11 and 12 at their bases and to deliver output signals at the first output terminals 10 and 10' connected to their respective collectors.

In the collector circuit of the respective amplifying transistors 18 and 19, a pair of NPN type load transistors 16 and 17 are inserted. The load transistors 16 and 17 are connected to each other by their bases, and the collectors thereof are connected to the collectors of the corresponding amplifying transistors 18 and 19, respectively. The emitters of the load transistors 16 and 17 are directly connected to a source terminal 15 to which a voltage source (not shown) is connected for providing operating voltage to the differential amplifiers therethrough.

A diode 21 with a second constant current source 22 is connected between the source terminal 15 and the connected bases of the load transistors 16 and 17 so that the direction of its P-N junction corresponds with that of the emitter-base junctions of the load transistors 16 and 17, whereby both load transistors 16 and 17 are provided with a common bias voltage across their emitter-base junctions by a voltage drop produced across the diode 21.

The second amplifier stage includes a pair of PNP type transistors 24 and 25 connected to each other by their emitters, as shown in FIG. 1, surrounded by a dot-dash line. The bases of the transistors 24 and 25 are connected to the first output terminals 10 and 10', respectively. The collectors of the transistors 24 and 25 are connected with second output terminals 13 and 14, and grounded through load resistors 26 and 27, respectively.

The transistors 24 and 25 are commonly provided, at their connected emitters, with a third constant current source comprised of a PNP transistor 23, a diode 28, and a resistor 29. The transistor 23 is connected to the source terminal 15 by its emitter and is connected to the transistors 24 and 25 by its collector. The diode 28 is connected between the emitter and the base of the transistor 23 and is connected to ground through the resistor 29.

In the preferred embodiment shown in FIG. 1, the features of this invention apply to the first amplifying stage. In this stage, the voltage drop produced across the diode 21 has a fixed value determined by the current flowing therethrough. As this voltage drop provides the bias voltage for the respective load transistors 16 and 17, the current flowing through the load transistors are determined by the current flowing through the diode 21. The later current is the same as the sink current in the second constant current source 22.

Therefore, when the diode 21 has voltage-current characteristics which are the same as those of the base-emitter junctions of the load transistors 16 and 17, and each of the load transistors 16 and 17 has a sufficiently high value of current amplification factor hFE, the magnitude of the respective currents flowing through the load transistors 16 and 17 agree with that of the sink current of the second constant current source 22.

A diode such as diode 21 can be easily obtained with the employment of well-known integrated circuit techniques. One of the preferred embodiments of such a diode as diode 21 is to directly interconnect the base and collector of a transistor. In this case, a transistor fabricated by the same manufacturing the process as that of the load transistors 16 and 17 may serve as the diode 21.

The diode 21 may also be obtained by diffusion of P type impurities into an N type semiconductor region. This should be accomplished during the manufacturing process in which the P type emitter regions are formed in the N type base regions of the respective load transistors.

As a result of biasing the load transistors 16 and 17 with the voltage across diode 21, it is possible to control the duty ratio of the output pulse signals at a desired value by merely varying the relationship between the sink currents of the first and second constant current sources 21 and 22 as follows.

It is now assumed that the first constant current source 20 can flow at $2I_o$ of the sink current thereinto, so that the current $I_o$ can flow through the collector circuits of both amplifying transistors 18 and 19 when the input signals supplied to the respective input terminals 11 and 12 are balanced. On the other hand, according to the present invention, the sink current of the second constant current source 22 is so designed as to have a value $I_o + \Delta I$ which is slightly larger in magnitude than the collector current $I_o$ mentioned above. It may be seen that now each of the load transistors 16 and 17 is energized to provide a current $I_o + \Delta I$ to its collector circuit, respectively.

However, it is only $I_o$ that is permitted to flow into the respective collectors of the amplifying transistors 18 and 19 when the input signals are balanced. Therefore, the excess current $\Delta I$ derived from the respective load transistors 16 and 17 may be diverted through the first output terminals 10 and 10' into the succeeding transistors 24 and 25 which constitute the second amplifier stage. It is actually impossible for the excess current $\Delta I$ to flow into the succeeding transistors 24 and 25 through their bases when the transistors 24 and 25 are of the PNP type. Thus, both load transistors 16 and 17 are forced to operate within their saturation regions to expend their excess currents internally. In this status, the voltage difference between the base and collector of each of the load transistors 16 and 17 is almost zero. Accordingly, when the input signals are balanced, both first output terminals 10 and 10' are at a high potential which is nearly equal to that at the source terminal 15, and both second output terminals 13 and 14 have earth potentials since the transistors 24 and 25 are now non-conductive, respectively.

In operation two sine wave input signals, shifted 180° in phase to each other, are impressed on the respective input terminals 11 and 12. The circuit operates as follows when the positive half cycle of the sine wave signal is supplied to the one input terminal 11 and the negative half cycle of the sine wave signal is supplied to the other input terminals 12.

In proportion to the variation of the input sine wave signal, the base potential of the amplifying transistor 18 increases initially so that the current $I_o'$ flowing through the collector of the amplifying transistor 18 increases over the initial current value $I_o$. On the other hand, the current $I_o''$ flowing through the collector of the other amplifying transistor 19 now decreases.

The load transistor 16 connected to the amplifying transistor 18 continues operating within the saturation region so long as the value of the current $I_o'$ is smaller than the value $I_o + \Delta I$ mentioned before. Therefore, the potential at the first output terminal 10 is maintained at a high potential level, and the second output terminal 14 is also maintained at the initial ground potential level.

When the base potential of the amplifying transistor 18 further rises and the current $I_o'$ increases to a level equal to the current value $I_o + \Delta I$, the load transistor 16 should be allowed to escape from the saturation region and operate in the active region thereof since all of the current $I_o + \Delta I$ delivered therefrom is now able to flow from the load transistor 16 into the amplifying transistor 18. In this condition, the potential of the first output terminal 10 is reduced to a low potential level nearly equal to the base potential of the amplifying transistor 18. The transistor 25, connected to the first output terminal 10, is then allowed to become conductive, and a current provided by the third constant current source flows through the transistor 25 into the load resistor 27, so that a voltage drop is produced across the load resistor 27. This voltage drop provides the second output terminal 14 with a high potential output signal level. This output signal level is produced in a pulse shape and is continuously produced during the period in which the collector current $I_o'$ of the amplifying transistor 18 is in excess of the current value $I_o + \Delta I$.

It will be apparent that the load transistor 17, connected to the amplifying transistor 19, is kept within the saturation region thereof during this half cycle of the sine wave. Therefore, no output signal is obtained from the second output terminal 13 during this period.

The second output terminal 13 may, of course, provide the high potential output signal level when the positive half cycle of the sine wave signal is applied on the terminal 12. In this period, the output terminal 14 is kept at the ground potential level.

Figure 2:
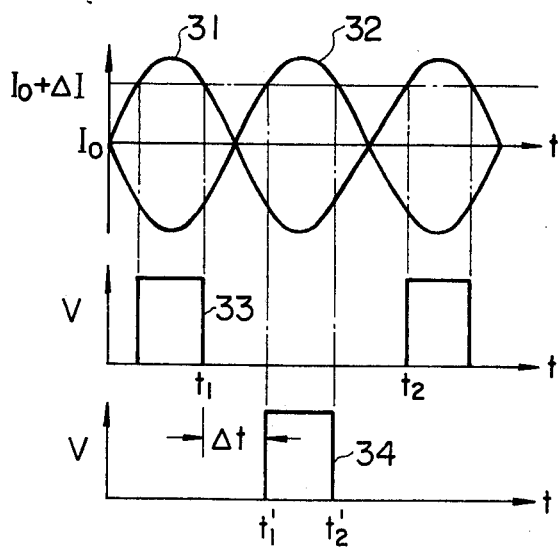
FIG. 2 is a waveform diagram showing the relationship between the input sine wave signals and the output pulse shape signals obtained from the circuitry shown in FIG. 1.

In FIG. 2 the relation between the collector currents of the amplifying transistors 18 and 19 and the thus obtained output signals from the second output terminals 13 and 14 is shown. Curves 31 and 32 represent the collector currents $I_o'$ and $I_o''$ of the amplifying transistor 18 and 19, respectively, each of which varies in proportion to its corresponding sine wave input signal. Pulse signals 33 and 34 represent the output signals delivered from the second output terminals 13 and 14, respectively.

It will be apparent by referring to FIG. 2 that each of the output signals 33 and 34 has a pulse width shorter than the half cycle of the sine wave, and that no pulse signals are produced during term $\Delta t$. This pulse width is in accord with the period in which the collector current 31 or 32 flows in excess of the value $I_o + \Delta I$.

The pulse width is controllable by varying the value $I_o + \Delta I$. With the circuit arrangement shown in FIG. 1, the current value $I_o + \Delta I$ is set in accordance with the sink current of the second constant current source 22, so that the pulse width of the derived output pulse signal can be made at any desired value according to the present invention.

It should be noted that the value $\Delta I$ may be a minus value. When the sink current $I_o + \Delta I$ of the second constant current source is designed to be smaller than the current $I_o$, the pulse width of the derived output signal should be longer than the half cycle of the sine wave. According to the present invention, therefore, it is possible to design the duty ratio of the output pulse signals to any desired value within the broad range of from zero to one hundred per cent.

In order to obtain output pulse signals having a predetermined value of duty ratio, it is necessary to set up the sink currents of the first and second constant current source 20 and 22 to an exactly predetermined ratio therebetween.

Figure 3:
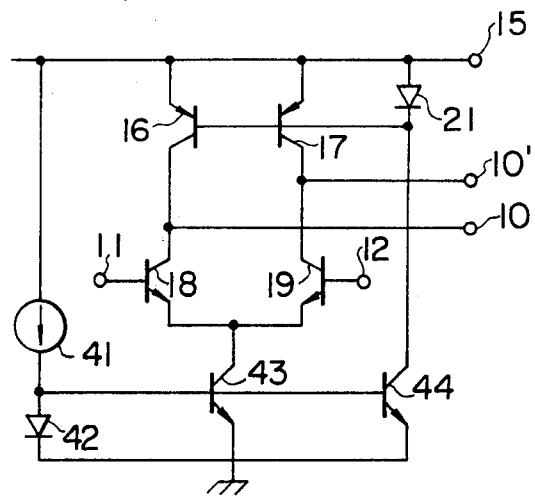
FIG. 3 is a schematic circuit diagram showing a portion of an embodiment of the transistor differential amplifier circuit according to the present invention.

In FIG. 3 a realized circuit which is suitable not only to accomplish the above, but also especially suitable to fabrication in an integrated circuit configuration on a semiconductor substrate is shown. Here the components which correspond to those in FIG. 1 bear the same reference numerals in FIG. 3.

NPN type transistor 43 and 44, provided with a commonly shared diode 42 which is between the respective base and emitters thereof, compose the first and second constant current sources corresponding to 20 and 22 in FIG. 1, respectively. Element 41 represents a constant current source connected between the diode 42 and source terminal 15 for providing a constant current to the diode 42.

According to the conventional semiconductor integrated circuit technology, the diode 42 and the transistors 43 and 44 are fabricated adjacently on the same semiconductor substrate, therefore, these elements have the same P-N junction characteristics. The diode 42 may be, of course, made up of a transistor similarly as the diode 21 described hereinbefore.

Having a sufficiently large value of current amplification factor, the transistors 43 and 44 should operatively provide their collector currents with a predetermined ratio therebetween proportional to the emitter areas thereof. To explain more precisely, it is now assumed that the transistors 43 and 44 have emitter areas 2 $A_E$ and $A_E + \Delta A_E$, respectively, and that the sink currents of the transistors 43 and 44 are 2 $I_o$ and $I_{c44}$, respectively. The ratio $\gamma$ between the currents $I_{c44}$ and $I_o$ is given by the following equation (1):

$$\gamma = \frac{I_{c44}}{I_o} \simeq (1 + \frac{\Delta A_E}{A_E})$$  (1)

It will be seen from the equation (1) that the current ratio $\gamma$ is determined by the size of the emitter area of the transistors 43 and 44. The current ratio $\gamma$ is independent of variations, for example, source voltage, ambient temperature, etc. Therefore, it is easily realized that two phase pulse signals with a desired duty ratio are obtained by substituting the circuit arrangement shown in FIG. 3 for the first amplifier stage shown in FIG. 1.

Figure 4:
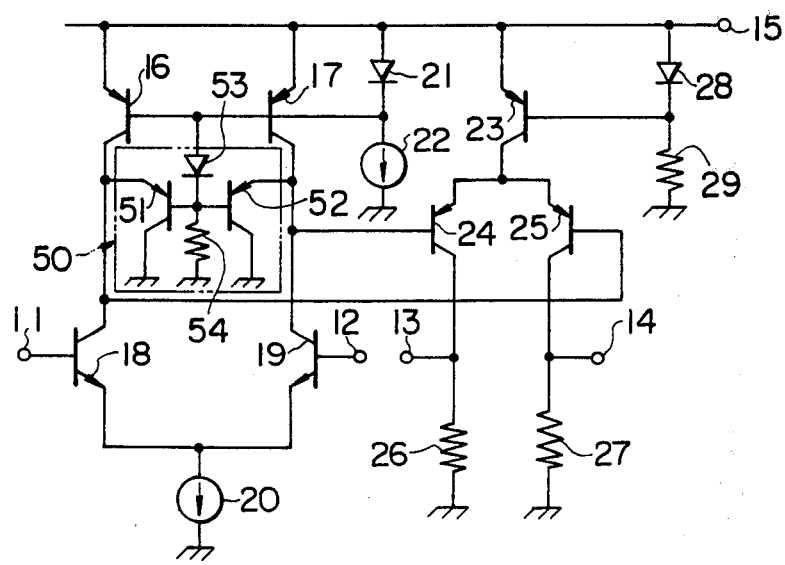
FIG. 4 is a schematic circuit diagram showing a further improved embodiment of the present invention.

Referring to FIG. 4, another improved differential amplifier circuit embodying the present invention is shown, which is similar to the circuit shown in FIG. 1 but further supplemented by a current bypass means 50. The current bypass means 50 is especially prepared to avoid any anticipated undesirable interconnections when the circuitry is formed in a semiconductor integrated circuit configuration.

As previously described, in the first amplifier stage, according to the present invention, the load transistors 16 and 17 are conditioned to operate within the saturation region when their corresponding amplifying transistors 18 or 19 limit the current delivered from the load transistors thereinto. Since the load transistors are in the saturation region, the collector potential rises slightly higher than the basic potential thereof, then the base-collector junction thereof is biased in a forward direction.

This means that there may be an injection of minority carriers from the collector region at the saturated load transistor. Formed in the semiconductor integrated circuit, therefore, the circuitry shown in FIG. 1 possesses such an undesirable possibility that the minority carrier injected from the collector of the load transistor may reach other circuit elements positioned in close proximity to the load transistors on the common semiconductor substrate. Thus, injected minority carriers may cause unexpected improper variations for which the circuit may operate with undesirable mode.

The current bypass means 50 is provided in order to effectively alleviate the foregoing anticipated defficiencies. Referring to FIG. 4, the current bypass means 50 includes a pair of PNP type transistors 51 and 52, whose emitters are respectively connected to the collectors of the load transistors 16 and 17. The collectors of the transistors 51 and 52 are directly connected to ground potential. The current bypass means 50 further includes a series circuit composed of a diode 53 and a bias resistor 54. The series circuit connects the commonly connected bases of the load transistors 16 and 17 to the ground potential therethrough. The bases of the transistors 51 and 52 are commonly connected to the junction between the diode 53 and the bias resistor 54. Thus, both bases of the transistors 51 and 52 are given a bias potential, lower than the base potential of the load transistors 16 and 17 by the potential drop produced across the diode 53.

Since the transistors 51 and 52 are conductive when their collectors have a potential higher than that at their bases, current bypasses for the excess currents are provided to the collectors of the respective load transistors 16 and 17 before these load transistors 16 and 17 reach their saturation regions. By using the current bypass means 50 in this manner, therefore, the amplifier circuit, according to the present embodiment, is assured of exact operation without any disadvantages.

From the foregoing description, it will be appreciated that two phase pulse signals, having a desired duty ratio, are produced from sine wave input signals by the transistor differential amplifier circuit of the present invention. Although two stage differential amplifier circuitry has been shown in FIG. 1, this has been especially designed for use in brushless motors using Hall-effect elements, wherein sine wave signals detected by the Hall-effect elements are supplied to the respective input terminal as input signals. Therefore, in this circuit, output pulse signals are delivered from the second amplifier stage with a sufficiently large current magnitude to satisfy the requirements for the field currents.

However, it should be noted that the fundamental feature of the present invention exists within the first amplifier stage, therefore, the succeeding stage may taken various circuit configurations in accordance with the objective for receiving and using the output pulse signals. Furthermore, while the description of the present invention has been made with reference to NPN type amplifying transistors and PNP type load transistors, it is believed to be obvious to one skilled in the art that the invention may also employ these transistors in an inversed order, and furthermore, well-known Darlington transistors may be substituted for any of these transistors.

Having described several embodiments of a new and improved transistor differential amplifier, circuit, constructed in accordance with the present invention, it is believed obvious that other modifications and various changes will be suggested to those skilled in the art.

What is claimed is:

1. A transistor differential amplifier circuit for producing pulse output signals from A.C. input signals comprising:
   a first amplifier stage comprising:
   a pair of first amplifying transistors of a first conductivity type connected to each other by their emitters;
   means for applying A.C. input signals between the bases of said first amplifying transistors;
   first constant current means commonly connected to both the emitters of said first amplifying transistors;
   a pair of load transistors of second conductivity type each connected by the collector thereof with the collector of a respective one of said first amplifying transistors and having their bases and emitters commonly connected to each other;
   diode means connected between the commonly connected bases and emitters of said load transistors for providing a voltage drop produced thereacross between the base and emitter of each of said load transistors; and
   second constant current means connected to said diode means for providing said diode means with a constant current;
   a second amplifier stage comprising:
   a pair of second amplifying transistors of the second conductivity type, and output means for deriving pairs of output signals from the emitter-collector paths of said second amplifying transistors; and
   means for connecting the collectors of said first amplifying transistors to the bases of said second amplifying transistors, respectively.

2. A transistor differential amplifier circuit according to claim 1 wherein said diode means is made up of a transistor, which has the same characteristics as said load transistors and whose collector and base are connected to each other.

3. A transistor differential amplifier circuit according to claim 1 wherein said diode means produces thereacross a voltage drop by which each of said load transistors is energized to allow a current, with the same magnitude as the constant current of said second constant current means, to be obtained therefrom.

4. A transistor differential amplifier circuit according to claim 3 wherein said second constant current means provides said diode means with a constant current different in magnitude from the currents which operatingly flow in the respective collectors of said amplifying transistors when said first input signals are balanced, whereby output pulse signals with controlled duty ratio are obtained.

5. A transistor differential amplifier circuit according to claim 1 wherein said first constant current means includes a first transistor of first conductivity type, the collector of which is commonly connected to the emitters of said first amplifying transistors, and wherein said second constant current means includes a second transistor of first conductivity type, the collector of which is connected to said diode means, and means for commonly providing said first and second transistors with a bias voltage between their emitter-base junctions.

6. A transistor differential amplifier circuit according to claim 5 wherein said first and second transistors are fabricated through the same manufacturing process to have their emitter area different in size to each other.

7. A transistor differential amplifier circuit according to claim 1 which further comprises current bypass means connected to the respective collectors of said load transistors for providing current bypasses to said respective collectors before the base-collector junctions of said load transistors become biased in a forward direction.

8. A transistor differential amplifier circuit according to claim 7, wherein said current bypass means consists of a pair of bypass transistors of the second conductivity type, each connected to the collector of a respective load transistor by the collector thereof, bias diode means connected to the bases of said load transistors, and a bias resistor connected to said bias diode means, the bases of said bypass transistors being connected to a junction between said bias diode means and said bias resistor.

9. A transistor differential amplifier circuit for producing pulse output signals from A.C. input signals comprising:
   a first amplifier stage comprising:
   a pair of first amplifying transistors of first conductivity type connected to each other by their emitters;
   means for applying A.C. input signals between the bases of said first amplifying transistors;
   first constant current means commonly connected to the emitters of said first amplifying transistors;
   a pair of load transistors of second conductivity type, each of which is connected by the collector thereof with the collector of a respective one of said first amplifying transistors and having their bases and emitters commonly connected to each other;
   diode means commonly connected between the commonly connected bases and emitters of said load transistors for providing a voltage drop produced thereacross between the base and emitter of each of said load transistors;
   second constant current means connected to said diode means for providing said diode means with a constant current;
   a second amplifier stage comprising:

a pair of second amplifying transistors of second conductivity type connected to each other by their emitters;

third constant current means commonly connected to the emitters of said second amplifying transistors for providing operation currents to said respective second amplifying transistors therefrom;

a pair of load elements each connected to the collector of a respective one of said second amplifying transistors; and a pair of output means connected to respective junctions between said load elements and the collectors of said second amplifying transistors, respectively, for delivering pairs of output signals therefrom; and means for connecting each of the collectors of said first amplifying transistors to each of the bases of said second amplifying transistors, respectively.

10. A transistor differential amplifier circuit according to claim 9, wherein said diode means is made up to a transistor, which has the same characteristics as said load transistors and whose collector and base are connected to each other.

11. A transistor differential amplifier circuit according to claim 9 wherein said diode means produces thereacross a voltage drop by which each of said load transistors is energized to allow a current, with the same magnitude as the constant current of said second constant current means to be obtained therefrom.

12. A transistor differential amplifier circuit according to claim 11 wherein said second constant current means provides said diode means with a constant current larger in magnitude than those currents which operatingly flow in the respective collectors of said first amplifying transistors when said input signals are balanced, whereby output pulse signals with a duty ratio less than 50% are delivered from said output means, respectively.

13. A transistor differential amplifier circuit according to claim 11 wherein said first constant current means includes a first transistor of first conductivity type, the collector of which is commonly connected to the emitters of said first amplifying transistors; and wherein said second constant current means includes a second transistor of first conductivity type, the collector of which is connected to said diode means and means for commonly providing said first and second transistors with a bias voltage between emitter-base junctions thereof.

14. A transistor differential amplifier circuit according to claim 13 wherein said first and second transistors are fabricated through the same manufacturing process to have their emitter area different in size to each other.

15. A transistor differential amplifier circuit for producing pulse output signals from A.C. input signals comprising at least a first amplifier stage comprising:

a pair of amplifying transistors of a first conductivity type connected to each other by their emitters;

means for applying A.C. input signals between the bases of said amplifying transistors;

first constant current means commonly connected to both the emitters of said first amplifying transistors;

means for deriving output pulse signals from the collectors of said amplifying transistors;

a pair of load transistors of second conductivity type each connected by the collector thereof with the collector of a respective one of said amplifying transistors and having their bases and emitters commonly connected to each other;

diode means connected between the commonly connected bases and emitters of said load transistors for providing a voltage drop produced thereacross between the base and emitter of each of said load transistors; and second constant current means connected to said diode means for providing said diode means with a constant current;

wherein said first and second current sources are adjustable such that the duty cycle of said output pulse signals is related to the ratio of the magnitude of said first and second current sources.

16. A transistor differential amplifier circuit according to claim 15, wherein said diode means is made up of a transistor, which has the same characteristics as said load transistors and whose collector and base are connected to each other.

17. A transistor differential amplifier circuit according to claim 15, wherein said diode means produces thereacross a voltage drop by which each of said load transistors is energized to allow a current, with the same magnitude as the constant current of said second constant current means, to be obtained therefrom.

18. A transistor differential amplifier circuit according to claim 17, wherein said second constant current means provides said diode means with a constant current different in magnitude from the currents which operatingly flow in the respective collectors of said first amplifying transistors when said input signals are balanced, whereby output pulse signals with controlled duty ratio are obtained.

19. A transistor differential amplifier circuit according to claim 15, wherein said first constant current means includes a first transistor of first conductivity type, the collector of which is commonly connected to the emitters of said first amplifying transistors, and wherein said second constant current means includes a second transistor of first conductivity type, the collector of which is connected to said diode means, and means for commonly providing said first and second transistors with a bias voltage between their emitter-base junctions.

20. A transistor differential amplifier circuit according to claim 19, wherein said first and second transistors are fabricated through the same manufacturing process to have their emitter area different in size to each other.

21. A transistor differential amplifier circuit according to claim 15, which further comprises current bypass means connected to the respective collectors of said load transistors for providing current bypasses to said respective collectors before the base-collector junctions of said load transistors become biased in a forward direction.

22. A transistor differential amplifier circuit according to claim 21, wherein said current bypass means consists of a pair of bypass transistors of the second conductivity type, each connected to the collector of a respective load transistor by the collector thereof, bias diode means connected to the bases of said load transistors, and a bias resistor connected to said bias diode means, the bases of said bypass transistors being connected to a junction between said bias diode means and said bias resistor.

23. A transistor differential amplifier as in claim 15, wherein the duty cycle of said output pulses is directly proportional to the ratio of the magnitude of said first and second current sources.

* * * * *

UNITED STATES PATENT OFFICE
CERTIFICATE OF CORRECTION

Patent No. 4,047,119            Dated September 6, 1977

Inventor(s)     Yoshito OHMURA and Takahiro OKABE

It is certified that error appears in the above-identified patent and that said Letters Patent are hereby corrected as shown below:

Title Page as it now reads:

[75]      Inventors: Yoshito Ohmura, Hachio; Takahiro

Title Page as it should read:

[75]      Inventors: Yoshito Ohmura, Hachioji; Takahiro

Signed and Sealed this

Twenty-first Day of February 1978

[SEAL]

Attest:

RUTH C. MASON            LUTRELLE F. PARKER
*Attesting Officer*        *Acting Commissioner of Patents and Trademarks*